(12) United States Patent
Pedersen

(10) Patent No.: US 6,975,258 B2
(45) Date of Patent: Dec. 13, 2005

(54) CIRCUIT FOR DIRECT DIGITAL DELTA-SIGMA CONVERSION OF VARIABLE ELECTRICAL CAPACITANCE

(75) Inventor: Michael Pedersen, Bethesda, MD (US)

(73) Assignee: Corporation for National Research Initiatives, Reston, VA (US)

(*) Notice: Subject to any disclaimer, the term of this patent is extended or adjusted under 35 U.S.C. 154(b) by 0 days.

(21) Appl. No.: 10/760,547

(22) Filed: Jan. 21, 2004

(65) Prior Publication Data

US 2004/0178938 A1 Sep. 16, 2004

Related U.S. Application Data

(60) Provisional application No. 60/441,768, filed on Jan. 23, 2003.

(51) Int. Cl.[7] .............................................. H03M 3/00
(52) U.S. Cl. ...................................... 341/143; 341/126
(58) Field of Search ........................ 341/118, 120, 143, 341/155–172, 126

(56) References Cited

U.S. PATENT DOCUMENTS

| | | | |
|---|---|---|---|
| 5,579,397 A * | 11/1996 | Ikeda et al. .................. | 381/113 |
| 6,067,363 A * | 5/2000 | Dent ............................ | 381/113 |
| 6,188,342 B1 * | 2/2001 | Gallo .......................... | 341/137 |
| 6,330,330 B2 * | 12/2001 | Scott et al. .................. | 379/413 |
| 6,362,769 B1 * | 3/2002 | Hovin et al. ................. | 341/157 |
| 6,646,582 B2 * | 11/2003 | Watanabe .................... | 341/143 |
| 6,697,000 B2 * | 2/2004 | LeReverend et al. ........ | 341/143 |
| 6,822,592 B2 * | 11/2004 | Gandolfi et al. ............. | 341/143 |
| 6,864,817 B1 * | 3/2005 | Salvi et al. .................. | 341/139 |
| 6,885,326 B2 * | 4/2005 | Zierhofer ..................... | 341/143 |
| 2003/0098699 A1 * | 5/2003 | Lemkin et al. .............. | 324/678 |

* cited by examiner

Primary Examiner—Peguy JeanPierre
Assistant Examiner—Linh Nguyen
(74) Attorney, Agent, or Firm—Nixon & Vanderhye P.C.

(57) ABSTRACT

An electronic circuit for the direct conversion of a capacitive transducer signal to a digital delta-sigma bit stream is disclosed. The electronic circuit is comprised of two functional blocks, in which the variable transducer capacitance is first transformed and represented by a frequency modulated (FM) signal by a variable frequency oscillator, and subsequently converted to a digital delta-sigma representation using a frequency delta-sigma modulator. The electronic circuit eliminates any need for analog components in conjunction with the capacitive transducer, and hence simplifies the front-end circuit for applications where digital signal processing (DSP) is used. The output bit stream of the electronic circuit is similar to other analog to digital delta-sigma converters, and can therefore be processed using similar digital techniques.

37 Claims, 6 Drawing Sheets

CIRCUIT FOR DIRECT DIGITAL DELTA-SIGMA CONVERSION OF VARIABLE ELECTRICAL CAPACITANCE

CROSS-REFERENCE TO RELATED APPLICATION

This application claims the benefit of Provisional Application No. 60/441,768, filed Jan. 23, 2003, the entire contents of which is hereby incorporated by reference in this application.

FIELD OF THE INVENTION

The present invention relates to electronic instrumentation circuitry, and more specifically to circuits used to determine and measure the static or dynamic change of electrical capacitance in capacitive or electrostatic transducers.

BACKGROUND OF THE INVENTION

Rapid developments in digital signal processing is one of the main development drivers in many systems containing acoustic detectors. In these types of systems 100 (see FIG. 1), an analog signal from an acoustic transducer 101 is normally converted into the digital domain using some analog signal conditioning circuit 102 and a multi stage delta-sigma converter 103. The digital signal is then processed by a processor 104 and subsequently converted back to an analog signal 105 for the loudspeaker 106 in the system 100.

Delta-sigma signal conversion has received much attention as the operating frequency of integrated circuits continues to increase. The conversion method is important because it allows one to shift noise sources out of the frequency band of interest. An important detail of the system, however, is that an analog front-end circuit 102 is required to convert the change of microphone capacitance into an electrical signal with the lowest possible addition of electrical noise. In addition, if condenser microphones are used, a circuit 107 to provide a DC bias voltage is also required. In electret microphones, the bias is provided internally and therefore only an amplifier is required.

Capacitive transducers are used to detect a variety of physical conditions, such as temperature, pressure (sound), and force (acceleration). The use of capacitive transducers is very prevalent because they provide unparalleled performance in terms of size, low inherent self-noise and power consumption. The problem with capacitive transducers, however, is that the output impedance is so high that the signal conditioning circuit 102 used to read out the transducer signal must have extremely high input impedance, so that it does not load, and thereby dampen, the already small sensor signal.

Three typical signal detection circuits are shown in FIGS. 2–4. The circuit shown in FIG. 2 is a transconductance amplifier 200, which has an inherent gain of less than 1 (typically about 0.8). In other words, the amplifier 200 transforms the signal from transducer 202 to a low impedance output at the expense of some of the signal level. The advantages of this circuit, apart from its simplicity, are low noise, very low power consumption and very low operating voltage. The most important drawbacks are poor power supply rejection and sensitivity to parasitic capacitances ($C_p$ in FIG. 2) between the transducer capacitance $C_t$ and the amplifier 200. Any parasitic capacitance will load the sensor signal leading to a gain factor K:

$$K = \frac{C_t}{C_t + C_p} < 1 \quad (1)$$

The circuit shown in FIG. 3, which is often referred to as a charge amplifier 300, overcomes the shortcomings of the transconductance amplifier 200 of FIG. 2. Since a differential amplifier 301 is used in circuit 300, the principle of virtual ground will exist on the input of the amplifier 301, which means the effect of the parasitic capacitance $C_p$ will be reduced by the open loop gain of the differential amplifier 301. Most differential amplifiers have open loop gains in excess of 100 dB, which makes the parasitic capacitance practically irrelevant. Secondly, since the differential amplifier 301 is a more sophisticated device than the simple transconductance amplifier 200 of FIG. 2, the power supply rejection will be at least 40–50 dB better. The gain of charge amplifier 300 is determined by the ratio of the capacitance $C_t$ of transducer 302 over the amplifier feedback capacitance $C_{fb}$, and can often be designed to be larger than 1. The feedback resistance $R_{fb}$ is necessary to ensure DC stability, and must be chosen large enough to ensure that the cut-off frequency of the filter $R_{fb}$ and $C_{fb}$ is outside the bandwidth of interest in transducer 302. The most important drawbacks of the charge amplifier circuit 300 are the power consumption and the relatively high required supply voltage. In addition, the self-noise of the charge amplifier 300 is higher than the transconductance amplifier 200. Since noise is normally a very important parameter, the transconductance amplifier 200 is preferred for many applications.

A possible solution to the noise problem in charge amplifier 300 is shown in FIG. 4. In the circuit 400 of FIG. 4, a harmonic voltage source $V_{sine}$ is used to bias the transducer 402. The harmonic source operates at a much higher frequency than the maximum frequency of interest in transducer 402. The signal from the harmonic source, called the carrier signal, experiences a gain in charge amplifier 400, which depends on the ratio of the transducer capacitance $C_t$ over the feedback capacitance $C_{fb}$. As the transducer capacitance changes, the amplifier gain changes, and hence the amplitude of the output signal $V_{out}$ changes. This constitutes a simple amplitude modulation (AM) circuit, and it is useful since it shifts the frequency of operation in charge amplifier 400 to a much higher frequency. Since the self-noise in charge amplifier 400 is dominated by 1/f noise, in effect, this circuit moves the frequency of operation to a regime where the self-noise is much lower, leading to improved performance. The amplitude modulated transducer signal can be demodulated with a simple low-pass filter. The major drawbacks of the AM circuit are high power consumption, high required supply voltage, and the need for a harmonic voltage source. Furthermore, the harmonic voltage source must have very stable amplitude, the variations of which will show as artifacts in the demodulated transducer signal. Implementing harmonic voltage sources with low amplitude noise is a challenging task.

With the incredible rise of digital circuit technology, microprocessors, and other very high speed digital processing circuits, the use of digital signal processing is now one of the most important technologies for instrumentation and communication applications. Two major digital signal processing applications in which capacitive transducers are also used are digital hearing aids and mobile phones. In both applications, an acoustic analog signal is converted to the digital domain, and then processed, filtered and transmitted. In FIG. 5, a commonly used circuit 500 is shown for conversion of the signal from the capacitive transducer 502 from the acoustic domain to the analog electrical domain with an amplifier 501, like those previously shown in FIGS. 2–4, and then to the digital domain using a delta-sigma converter 503 of the analog signal. The result is a high frequency digital bit stream 504, in which the transducer signal is quantized and represented as a sequential stream of bits suitable for a direct feed to a digital signal processor ("DSP"), such as that shown in FIG. 1. While circuit 500 can be built to perform with very low self-noise, it requires analog circuitry and amplifiers, which cannot be readily integrated with a DSP on the same chip, due to limitations in integrated circuit manufacturing. A possible solution to this problem is the circuit 600 shown in FIG. 6, in which no analog circuitry is used with the transducer 602. The capacitive transducer 602 is connected to a ring oscillator 601 which has a digital output with a frequency given by:

$$f_{osc} = \frac{1}{R_{osc} C_t \ln\left[\frac{(2V_{sup} - V_{sw})(V_{sup} + V_{sw})}{(V_{sup} - V_{sw})V_{sw}}\right]} \quad (2)$$

where $R_{osc}$ is the oscillator timing resistance, $V_{sup}$ is the supply voltage, and $V_{sw}$ is the switching voltage of the inverters 603. As the capacitance $C_t$ of transducer 602 changes, the oscillator frequency changes according to equation (2), and the result is an output with a frequency modulated (FM) representation of the transducer signal. The problem with this digital detection circuit 600 is that the FM output is not directly compatible with the input required on a DSP, and would hence require extra processing, such as up or down conversion, to be used.

SUMMARY OF THE INVENTION

It is an object of the present invention to provide a circuit that can convert a capacitive transducer signal directly to a digital representation that can be fed directly to a digital signal processor (DSP).

It is another object of the present invention to provide a capacitive transducer signal to digital conversion circuit that uses components that can be implemented in the same fabrication process as a DSP.

It is a further object of the present invention to provide a capacitive transducer signal to digital conversion circuit in which a direct conversion takes place of the analog transducer signal to a digital delta-sigma representation with minimal quantization noise.

It is a further object of the present invention to provide a capacitive transducer signal to digital conversion circuit in which power consumption is reduced by minimizing the number of active components.

It is yet a further object of the present invention to provide a capacitive transducer signal to digital conversion circuit in which the sensitivity to changes in the capacitive transducer signal is maximized, and in which the circuit self-noise is minimized.

The present invention is a novel analog to digital conversion circuit with the ability to directly convert an analog acoustic signal into a digital bit stream with delta-sigma properties. The conversion circuit of the present invention allows the implementation of a full digital front-end in digital signal processing systems used in products, such as hearing aids and wireless communications equipment, such as mobile phones. The circuit is especially useful for integration with MEMS-based condenser microphones, in which the working capacitance of the device is below 1 pF.

In the conversion circuit of the present invention, the analog front-end (and DC bias circuit for condenser microphones) is eliminated. The transducer signal is converted directly into a frequency modulated (FM) digital signal, which is subsequently converted into a delta-sigma bit stream. The advantages of this approach over the analog front-end with a multi-stage sigma-delta converter are circuit simplification, reduced power consumption (due to less gates), much improved power supply rejection, and the potential to integrate the entire front-end on a single chip made with a high performance digital IC fabrication process.

The circuit of the present invention is remarkably simple and is the result of combining together preferably a ring oscillator with a variable output frequency and a frequency delta-sigma modulator (FDSM). Although a ring oscillator is preferable, it should be noted that other kinds of oscillators, such as a relaxation oscillator, could be used in the present invention. The capacitive microphone is combined with the ring oscillator to create a frequency-modulated digital signal, in which the modulation frequency is that of the acoustic signal, and in which modulation frequency depth is directly proportional to the deflection of the microphone diaphragm in response to the acoustic signal. The modulated signal is quantized into a delta-sigma representation, which is directly compatible with DSP technologies.

The present invention converts a frequency-modulated digital signal, such as the output signal of the circuit shown in FIG. 6, directly to delta-sigma representation using a frequency-delta-sigma modulator 700, such as that shown in FIG. 7, based on modulo-2 arithmetic. The frequency-delta-sigma converter shown in FIG. 7 uses a simple modulo-2 edge-counter 701, using a high frequency clock signal $f_{clk}$, and a modulo-2 XOR differentiator 702, to achieve delta-sigma shaping of the noise on the output of the circuit (a key feature of delta-sigma conversion). By combining the circuits of FIGS. 6 and 7, a new circuit, shown in FIG. 8, results, which is capable of the direct digital delta-sigma conversion of an analog capacitive transducer signal. The incoming analog signal, such as sound, pressure, force, temperature or any other stimulus, is converted into electrical capacitance in the transducer, and subsequently to a digital delta-sigma representation in the circuit. The circuit can be implemented and optimized in any digital integrated circuit fabrication process, and may even be incorporated directly in a DSP circuit, thereby eliminating any need for additional circuits beyond the DSP. Reducing the component count is very important in applications, such as hearing aids and mobile communications.

DETAILED DESCRIPTION OF THE PREFERRED EMBODIMENT

Figure 8:
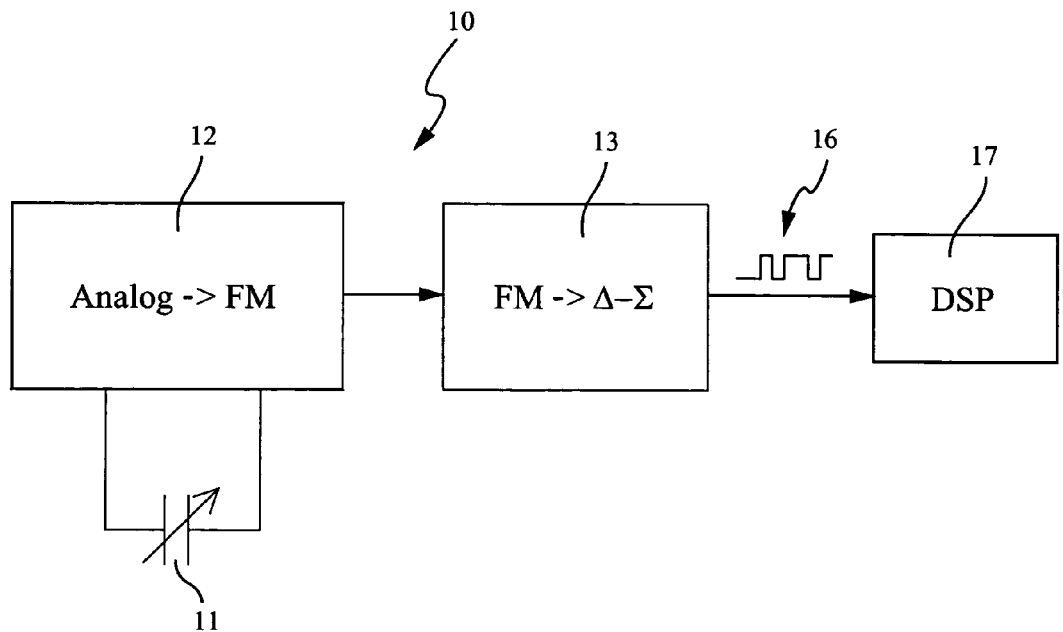
FIG. 8 is a block diagram of the direct delta-sigma conversion circuit according to the present invention.
Figure 9:
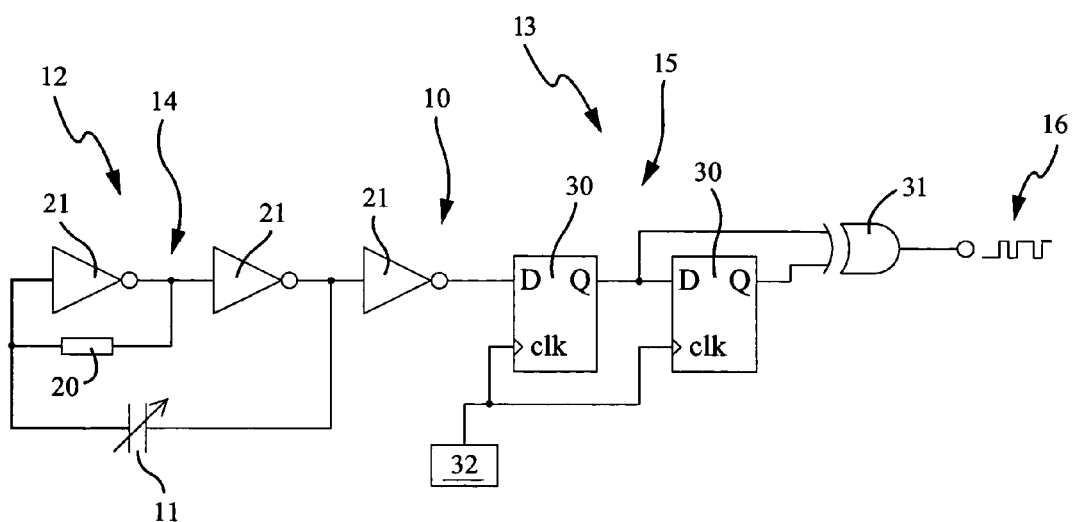
FIG. 9 is a preferred detailed diagram of the direct delta-sigma conversion circuit according to the present invention.

One embodiment of a direct delta-sigma conversion circuit 10 according to the present invention is shown in the block diagram of FIG. 8, and in the more detailed circuit diagram of FIG. 9. Circuit 10 preferably consists of a capacitive transducer 11 and two functional blocks 12 and 13. Functional block 12 converts changes in capacitance within capacitive transducer 11 to a frequency modulated digital signal, the frequency of which depends directly on the instantaneous capacitance of transducer 11. Transducer 11 can be wired to functional block 12 using bond pads (not shown) or it can be monolithically integrated with conversion circuit 10. Functional block 13 converts a frequency modulated digital signal to a delta-sigma digital bit stream 16, in which the instant frequency of the FM signal from functional block 12 is represented. A common important feature for functional blocks 12 and 13 is that they are implemented using components readily available in any commercial integrated circuit fabrication process.

A preferred embodiment of functional block 12 is a ring oscillator 14, in which the resonance frequency of oscillator 14 is directly dependent on transducer capacitance 11 and a timing resistor 20. Inverters 21 set up a continuous charging and discharging of the transducer capacitance 11 through timing resistor 20, with the cycle time for the charging and discharging being:

$$T_{osc} = R_{osc} C_t \ln \left[ \frac{(2V_{sup} - V_{sw})(V_{sup} + V_{sw})}{(V_{bat} - V_{sw})V_{sw}} \right] \quad (3)$$

where $R_{osc}$ is the resistance of timing resistor 20, $C_t$ is the transducer capacitance 11, $V_{sup}$ is the supply voltage for inverters 21, and $V_{sw}$ is the switching voltage for inverters 21. Inverters 21 are preferably designed to have a switching voltage equal to one half of the supply voltage. The oscillator frequency is simply the inverse of the cycle time in equation (3), which yields the expression shown in equation (2). While this simple oscillator scheme is preferred, many other more sophisticated oscillators can be implemented for use in functional block 12. Such oscillators may, for example, be based on crystals to achieve higher precision and lower sensitivity to temperature and other external noise interference.

A preferred embodiment for functional block 13 is shown in FIG. 9. The preferred circuit for block 13 shown in FIG. 9 is a frequency delta-sigma modulator (FDSM) 15, in which the frequency modulated (FM) output signal from functional block 12 is transformed into delta-sigma bit stream 16 by functional block 13. The delta-sigma bit stream 16 output by block 13 is then processed by a DSP 17 connected to the output of block 13, as shown in FIG. 8. DSP 17 can be wired to block 13 using bond pads or it can be monolithically integrated to conversion circuit 10.

Figure 1:
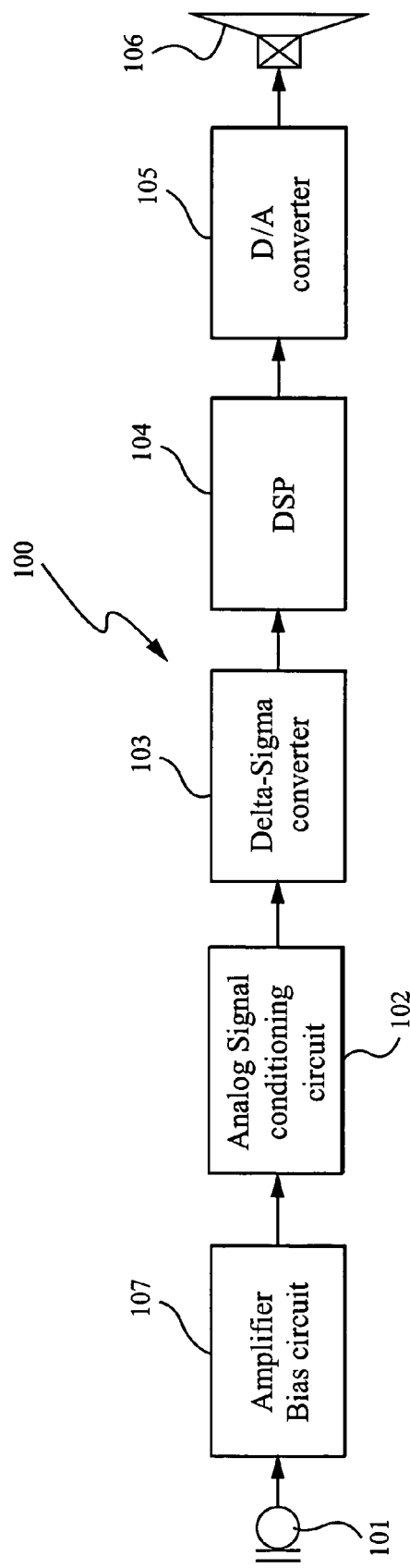
FIG. 1 is a block diagram showing a typical prior art acoustic digital processing system.
Figure 2:
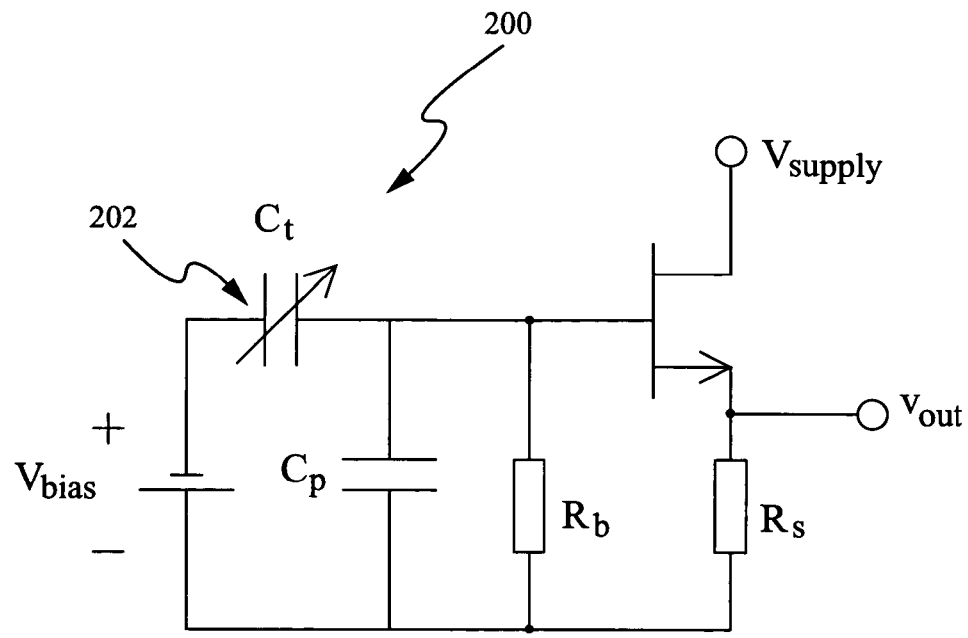
FIG. 2 is a prior art transconductance amplifier circuit for the detection of a capacitive transducer signal.
Figure 3:
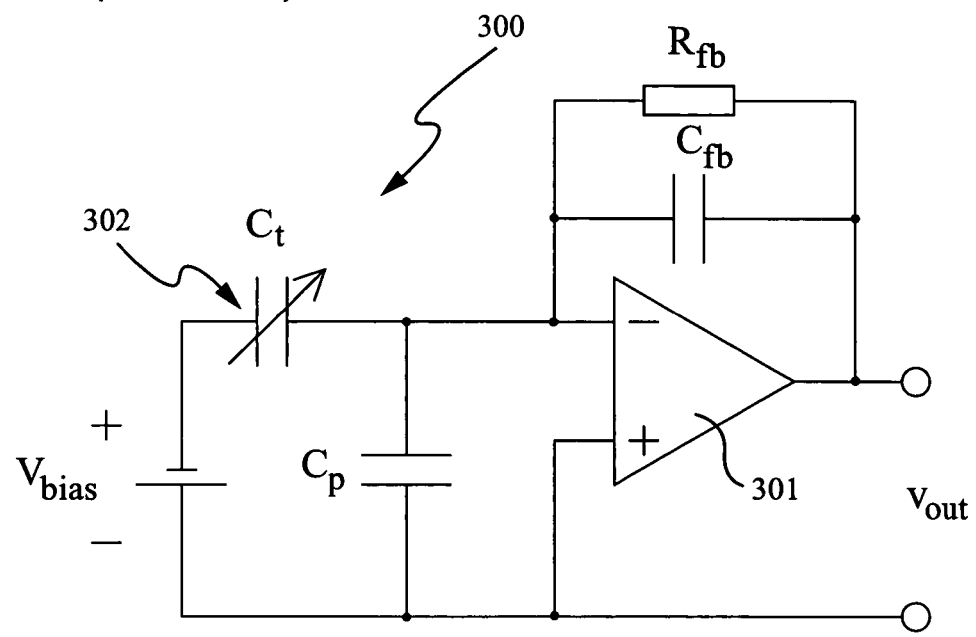
FIG. 3 is a prior art charge amplifier circuit for the detection of a capacitive transducer signal.
Figure 4:
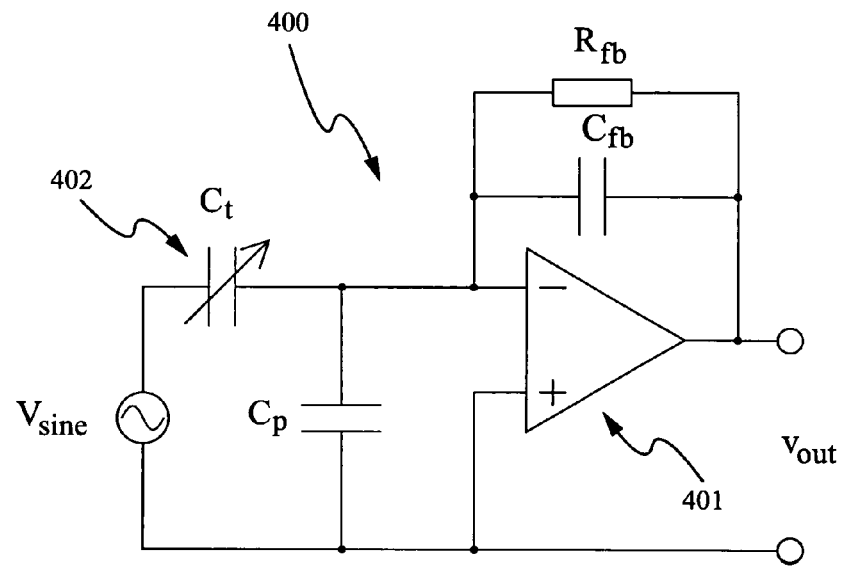
FIG. 4 is a prior art amplitude modulation (AM) circuit for the detection of a capacitive transducer signal.
Figure 5:
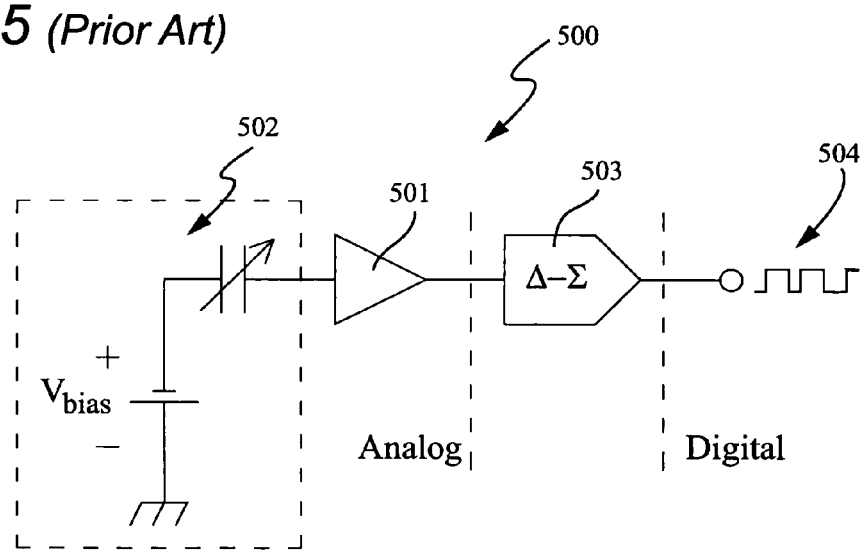
FIG. 5 is a prior art block diagram of a circuit to convert a capacitive transducer signal to a digital delta-sigma representation.
Figure 6:
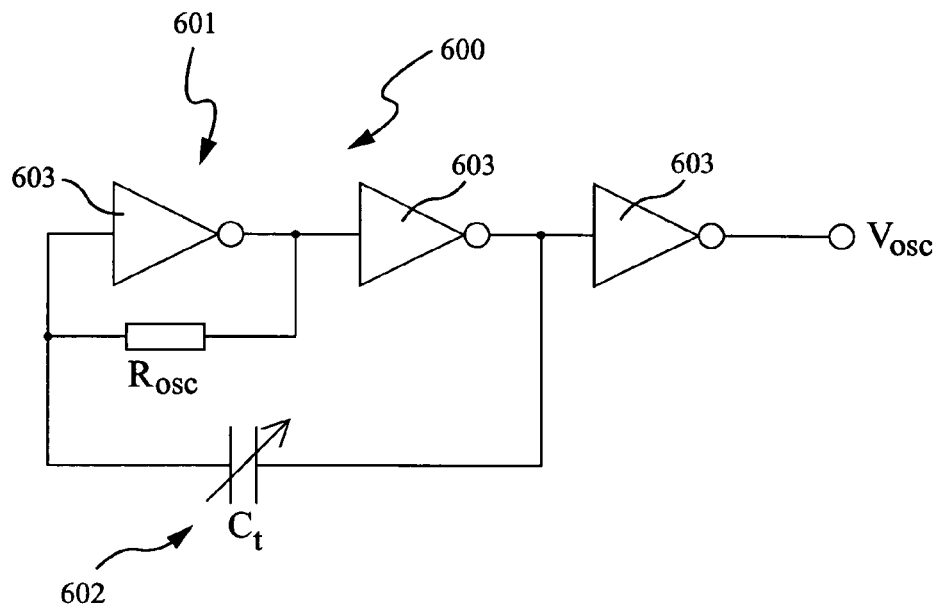
FIG. 6 is a prior art frequency modulation (FM) circuit to convert a capacitive transducer signal to a digital FM signal.
Figure 7:
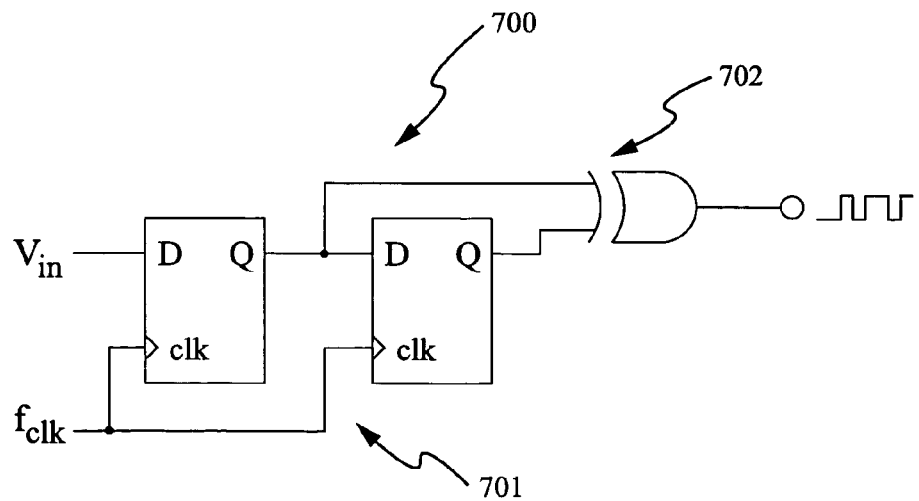
FIG. 7 is a prior art frequency delta-sigma modulator (FDSM) circuit for the conversion of an FM signal to delta-sigma bit stream.

The circuit in functional block 13 consists of two D-type flip-flops 30, an exclusive-OR (XOR) logic gate 31 and an internal oscillator 32. The principle of circuit 15 is simple pulse counting of the FM signal, in which the flip-flops 30 perform edge counting and hard limiting, and the dump and reset of the output bit is carried out by the XOR logic gate 31. For the FDSM circuit 15 to perform correctly, the sampling frequency of the internal oscillator 32 must satisfy the Nyquist criterion, which requires the sampling frequency to be at least twice that of any frequency seen in the FM signal. In the conversion of the FM signal in circuit 15, a quantization error will appear in the resulting output bit stream 16. This error is caused by the finite period of the sampling clock from internal oscillator 32, and its independence from the transducer FM signal. As the operating frequency of internal oscillator 32 is increased, the quantization error in the output bit stream 16 is diminished. The quantization error is shaped in the FDSM circuit 15 in a fashion similar to a conventional analog voltage delta-sigma converter, as shown in FIG. 5. The signal-to-quantization noise ratio (SQNR) of the FDSM is approximately:

$$SQNR = 20 \log\left[\frac{SR}{\sqrt{2}}\right] - 20 \log\left[\frac{\pi}{6}\left(2\frac{f_{max}}{f_{clk}}\right)^{3/2}\right] \quad (4)$$

where $f_{max}$ is the maximum frequency seen in the FM signal from functional block 12, $f_{clk}$ is the frequency of the internal oscillator 32, and SR is the output signal range in the output bit stream of functional block 13. The output signal range, in turn, is:

$$SR = \frac{4\Delta f}{f_{clk}} \quad (5)$$

where $\Delta f$ is the maximum frequency deviation in the FM signal from functional block 12, caused by changes in transducer capacitance 11. The output bit stream 16 from functional block 13 is a continuous digital representation at a much higher frequency than the frequency of interest in the transducer 11. It is typically decimated into larger blocks to form words at a lower data rate, which are then digitally filtered to remove high frequency signals outside the transducer bandwidth of interest. This is usually performed by circuitry, such as $sinc^2$ decimators and digital recursive filters, integrated directly in the DSP. The word length must be chosen such that the word resolution will meet or surpass the SQNR described in equation (4) above.

Figure 10:
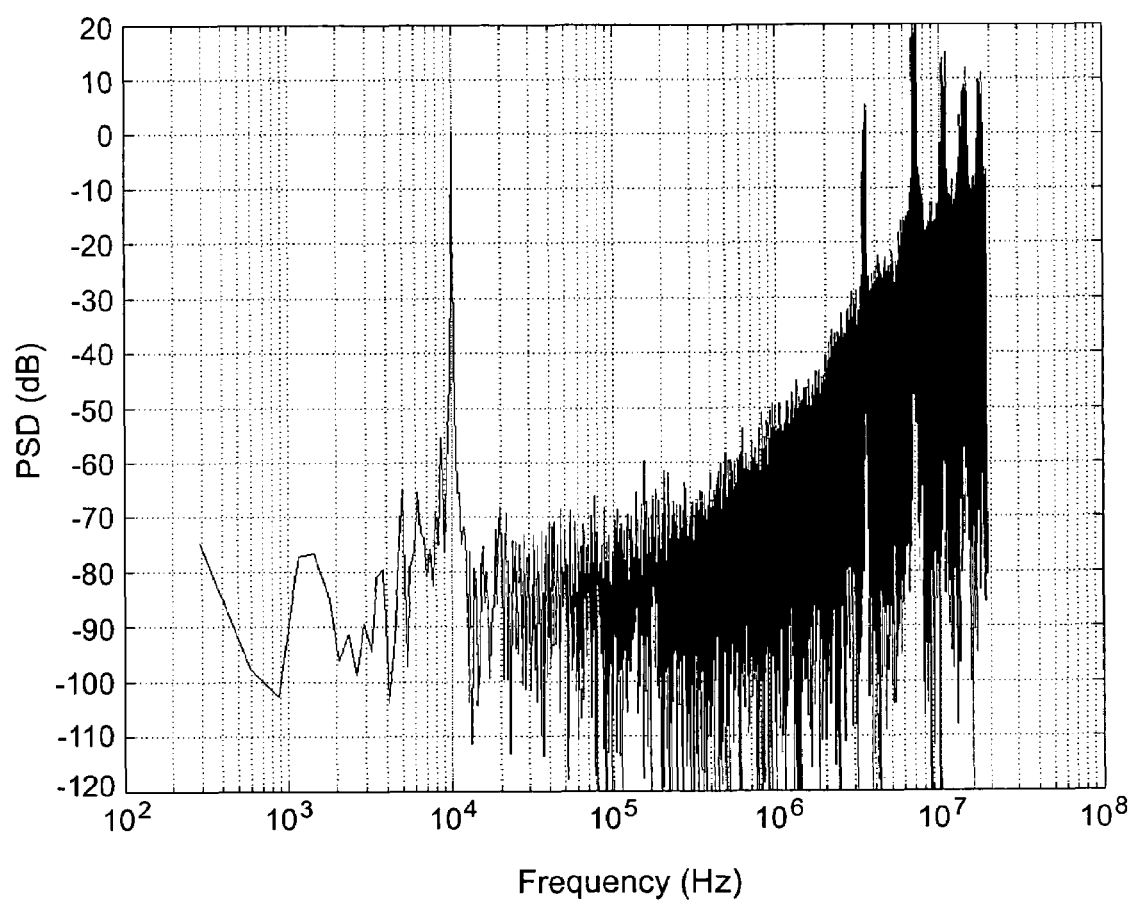
FIG. 10 is a calculated Fast-Fourier transform (FFT) of the output of a direct delta-sigma conversion circuit according to the present invention.

To demonstrate the function of the converter circuit 10 according to the present invention, the performance of the circuit is, by way of example, calculated for a transducer capacitance of 987 fF. A stimulus applied to the transducer at a frequency of 10 kHz, for example, causes a dynamic change in the transducer capacitance with similar frequency and an amplitude of 5.13 fF. Circuit 10 shown in FIG. 9 can be made with electronic integrated circuit components commercially available from AMI Semiconductor, for example. The performance of circuit 10 can be calculated using precise physical models of the circuit components available from the circuit manufacturer. The sampling frequency of internal oscillator 32 is preferably 38.5 MHz, although other sampling frequencies could be used. In FIG. 10, the Fast-Fourier transform (FFT) of the resulting output bit stream 16 is shown. The FFT was performed on $2^{17}$ samples of the bit stream 16. As can be seen from FIG. 10, the transducer signal at 10 kHz is clearly visible, with the signal to noise ratio of circuit 10 being approximately 75 dB. Another important feature in FIG. 10 is the increasing slope in the spectrum at higher frequencies. This is a well known property of delta-sigma conversion and this part of the spectrum is usually removed in the DSP using digital filtering. FIG. 10 shows that the signal to noise ratio of 75 dB can be achieved in a transducer frequency range of approximately 100 kHz. It is possible to design circuits according to the present invention with higher signal to noise ratio at the expense of decreased frequency range (bandwidth). The preferred embodiment of functional block 13 according to the present invention constitutes a first order frequency delta-sigma modulator. It is possible to implement frequency delta-sigma modulators of higher orders, to achieve larger signal-to-noise ratios if so desired.

Although the present invention has been described in terms of particular embodiments, it is not intended that the invention be limited to such disclosed embodiments. Modifications of the embodiments within the spirit of the invention will be apparent to those skilled in the art. The scope of the invention is defined by the claims that follow.

What is claimed is:

1. A circuit for converting an analog capacitive transducer signal to a digital signal comprising:
   a first circuit for generating a digital signal that can vary in frequency, the capacitive transducer being connected to the digital signal generator, whereby a change of capacitance in the transducer causes the frequency of the digital signal generator to vary;
   a second circuit for generating a delta-sigma bit stream that can vary in density, whereby changes in the frequency of the digital signal generator causes the density of the delta-sigma bit stream to vary proportionally.

2. The circuit according to claim 1, wherein the capacitive transducer is a continuously variable capacitor.

3. The circuit according to claim 1, wherein the first circuit is an oscillator wherein the capacitance of the capacitive transducer controls the oscillator's oscillation frequency.

4. The circuit according to claim 3, wherein the oscillator is a ring oscillator.

5. The circuit according to claim 3, wherein the oscillator is a relaxation oscillator.

6. The circuit according to claim 1, wherein the second circuit is a frequency delta-sigma modulator.

7. The electronic circuit according to claim 6, wherein the frequency delta-sigma modulator uses modulo-2 arithmetic.

8. The electronic circuit according to claim 6, wherein the frequency delta-sigma modulator is comprised of an edge-counter using a high frequency clock signal and a modulo-2 exclusive OR differentiator.

9. The circuit according to claim 6, wherein the frequency delta-sigma modulator has an order of one or higher.

10. The circuit according to claim 1, wherein the second circuit includes an internal oscillator for sampling.

11. The circuit according to claim 1, wherein the second circuit uses an external signal for sampling.

12. The circuit according to claim 11, wherein the external signal for sampling is provided by an external digital signal processing unit.

13. The circuit according to claim 12, wherein the external digital signal processing unit includes facilities for decimation and filtering of the bit stream from the second circuit.

14. The circuit according to claim 1 further comprising bond pads for wiring the first circuit to the capacitive transducer.

15. The circuit according to claim 1, wherein the capacitive transducer is monolithically integrated with the conversion circuit.

16. The circuit according to claim 1 further comprising bond pads for wiring the external digital signal processing unit to the second circuit to the external digital signal processing unit.

17. The circuit according to claim 1, wherein the external digital signal processing unit is monolithically integrated with the conversion circuit.

18. The circuit according to claim 1, wherein the frequency modulation block and frequency to delta-sigma bit stream conversion block are realized using digital CMOS circuit components.

19. The circuit according to claim 18, wherein the digital CMOS circuit components are realized using the same fabrication process used to make the external digital signal processing unit.

20. The circuit according to claim 1 further comprising an external digital signal processing unit receiving the delta-sigma bit stream generated by the second circuit.

21. An electronic circuit for the detection and conversion of a capacitive transducer signal comprising:
    a frequency modulation block;
    a frequency to delta-sigma bit stream conversion block receiving the output of the frequency modulation block;
    an external capacitor connected to the frequency modulation block; and
    an external digital signal processing unit receiving the output of the frequency to delta-sigma bit stream conversion block;
    whereby a change of capacitance in the external capacitor causes a change in oscillation frequency within the frequency modulation block, and the change in oscillation frequency causes a change in the output bit stream of the frequency to delta-sigma bit stream conversion block, and
    wherein the frequency to delta-sigma bit stream conversion block requires an external signal for sampling and the external signal for sampling is provided by the external digital signal processing unit.

22. The electronic circuit according to claim 21, wherein the external capacitor is a continuously variable capacitor.

23. The electronic circuit according to claim 21, wherein the frequency modulation block is an oscillator, and wherein the external capacitor controls the oscillation frequency.

24. The electronic circuit according to claim 21, wherein the oscillator is a ring oscillator.

25. The electronic circuit according to claim 21, wherein the frequency to delta-sigma bit stream conversion block is a frequency delta-sigma modulator.

26. The electronic circuit according to claim 25, wherein the frequency delta-sigma modulator uses modulo-2 arithmetic.

27. The electronic circuit according to claim 25, wherein the frequency delta-sigma modulator has an order of one or higher.

28. The electronic circuit according to claim 21, wherein the frequency to delta-sigma bit stream conversion block includes an internal oscillator for sampling.

29. The electronic circuit according to claim 21, wherein the external digital signal processing unit includes facilities for decimation and filtering of the bit stream from the frequency to delta-sigma bit stream conversion block.

30. The electronic circuit according to claim 21, wherein the external capacitor is connected to the frequency modulation block using bond pads for wiring to the external capacitor.

31. The electronic circuit according to claim 21, wherein the external capacitor is connected to the frequency modulation block using monolithic integration of the electronic circuit with the external capacitor.

32. The electronic circuit according to claim 21, wherein the external digital signal processing unit is connected to the frequency to delta-sigma bit stream conversion block by bond pads for wiring to the external digital signal processing unit.

33. The electronic circuit according to claim 21, wherein the external digital signal processing unit is connected to the frequency to delta-sigma bit stream conversion block using monolithic integration of the electronic circuit with the external digital signal processing unit.

34. The electronic circuit according to claim 21, wherein the frequency modulation block and frequency to delta-sigma bit stream conversion block are comprised of digital CMOS circuit components.

35. The electronic circuit according to claim 34, wherein the digital CMOS circuit components are formed using the same fabrication process used to make the external digital signal processing unit.

36. A circuit for converting an analog capacitive transducer signal to a digital signal comprising:
   a first circuit for generating a digital signal that can vary in frequency, the capacitive transducer being connected to the digital signal generator, whereby a change of capacitance in the transducer causes the frequency of the digital signal generator to vary;
   a second circuit for generating a delta-sigma bit stream that can vary in density, the second circuit receiving the frequency varying digital signal from the first circuit, whereby changes in the frequency of the digital signal generator causes the density of the delta-sigma bit stream to vary proportionally; and
   an external digital signal processing unit receiving the delta-sigma bit stream from the second circuit for further processing.

37. A circuit for converting an analog transducer signal into a digital signal comprising:
   a first circuit for generating a digital signal that can vary in frequency, the transducer being connected to the digital signal generator, whereby a change in the transducer's characteristics or output causes the frequency of the digital signal generator to vary; and
   a second circuit for generating a delta-sigma bit stream that can vary in density, whereby changes in the frequency of the digital signal generator causes the density of the delta-sigma bit stream to vary proportionally.

* * * * *